United States Patent [19]

Roustin

[11] Patent Number: 5,307,360
[45] Date of Patent: Apr. 26, 1994

[54] METHOD OF WIRING A ROW OF LASERS AND A ROW OF LASERS WIRED BY THIS METHOD

[75] Inventor: Pascal Roustin, Clamart, France

[73] Assignee: Thomson Hybrides, Puteaux, France

[21] Appl. No.: 990,509

[22] Filed: Dec. 15, 1992

[30] Foreign Application Priority Data

Dec. 20, 1991 [FR] France ................ 91 15899

[51] Int. Cl.$^5$ ................ H01S 3/18
[52] U.S. Cl. ................ 372/43; 372/50; 257/719
[58] Field of Search ........ 372/43, 50; 257/99, 257/719, 734, 773

[56] References Cited

U.S. PATENT DOCUMENTS

| | | | |
|---|---|---|---|
| 3,531,735 | 9/1970 | Collins et al. | 331/94.5 |
| 4,663,652 | 5/1987 | Nishizawa | 385/88 |
| 4,727,649 | 3/1988 | Nishizawa | 385/92 |
| 4,856,015 | 8/1989 | Matsui et al. | 372/50 |
| 5,177,753 | 1/1993 | Tanaka | 372/36 |

OTHER PUBLICATIONS

Suzuki, et al., Japanese Journal of Applied Physics, vol. 20, No. 3, Mar. 1981, pp. L229-L232. "1.5 mum Region BH Laser Array".
Ackley, Applied Physics Letters, vol. 42, No. 2, Jan. 1983, pp. 152-154. "Single Longitudinal mode operation of high power multiple-strip injection lasers".
Kumiko, Patent Abstracts of Japan, JP1136385, May 29, 1989. "Semiconductor Laser Device".
Zory, IBM Technical Disclosure Bulletin, vol. 18, No. 10, Mar. 1976, p. 3497. "Continuous Wave Laser Array".

*Primary Examiner*—Frank Gonzalez
*Attorney, Agent, or Firm*—Oblon, Spivak, McClelland, Maier & Neustadt

[57] ABSTRACT

The invention applies to a row of semiconductor lasers. To dissipate the heat generated during operation, this row of lasers is wired by a thick metal tape (11) brazed (points 12) to the mesas (9) which surround the laser cavities (2). The other electrical polarity is applied by the support plate (3) through the substrate (1).

18 Claims, 1 Drawing Sheet

METHOD OF WIRING A ROW OF LASERS AND A ROW OF LASERS WIRED BY THIS METHOD

BACKGROUND OF THE INVENTION

This invention is a method of electrically wiring a row of semiconductor lasers and the row of lasers wired by this method.

Semiconductor lasers, like all discrete or integrated semiconductors, are produced in groups on wafers which are then snapped into bars, the snapping operation being designed to expose the two cut faces of the Fabry-Perot cavity in a laser. The bars themselves are then snapped either into individual laser chips or into smaller bars forming, for example, a row of 10 to 30 lasers. Such a row of lasers provides greater optical power but distributing electrical current to them can be a problem.

FIG. 1 is a longitudinal cross-section of a row of lasers according to the prior art. Semiconductor body 1 comprises a substrate and a number of semiconductor layers which need not be detailed here: the aim of the structure is to create laser emitter zones 2 which, when suitably polarized, emit light.

A metal support 3, to which the row of lasers is brazed, can form the first electrical terminal, for example the ground.

The second electrical terminal is on the top face of the row, i.e. that opposite the support so that the electric current flows through the laser emitter zones 2. Two methods of applying the current to this top face are known to the prior art. Either a metal film 4 is deposited, but there is then a risk of a break in the film at 5, on the edges, or there can be areas of shade since the laser zones 2 are separated by grooves 6 to channel the current vertically. Alternatively, small metallized areas 7 are deposited only on those parts of the top face which lie above the laser emitters 2 and 25 μm diameter gold wires 8 are then attached to these metallized areas 7 by thermocompression brazing. Electric current is fed to the lasers individually.

These individual solutions present at least two disadvantages:
they provide virtually no thermal dissipation, even though lasers generate considerable heat,
the length of the gold wires varies depending on the position of the individual lasers to which they are connected and these different lengths cause inequality in the voltages applied.

SUMMARY OF THE INVENTION

The method according to the invention aims to overcome these disadvantages: the lasers in each row of lasers are wired collectively and the electric current is carried by a rod of a more complex geometrical shape, for example a flat gold rod brazed on the metallized areas deposited on the mesas. This rod is thick and offers only low electrical resistance: it acts as a heat sink and also ensures equal voltage is applied to all lasers.

To be more precise, the invention is a method of wiring a row of semiconductor lasers comprising a substrate supporting a number of mesa structures each surrounding a laser cavity, the method including at least the following two steps:
the electrolytic plating of the metallized areas covering the mesas,
the connection, by thermocompression brazing, of a thick metal plate, running along the row of lasers, to the aforementioned metallized areas.

BRIEF DESCRIPTION OF THE DRAWINGS

The invention will be better understood upon reading the following description of an example of an embodiment, referring to the appended figures of which.

DETAILED DESCRIPTION OF THE INVENTION

Figure 1:
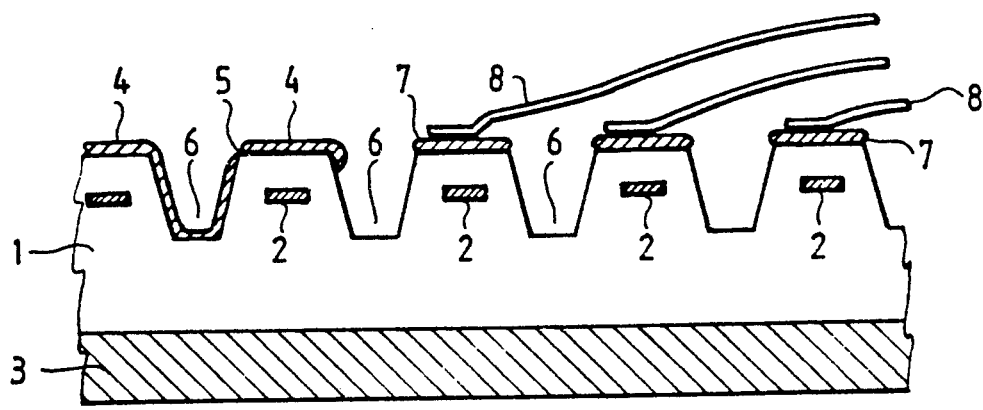
FIG. 1 is a cross-section on a row of lasers according to the prior art, as described previously.
Figure 2:
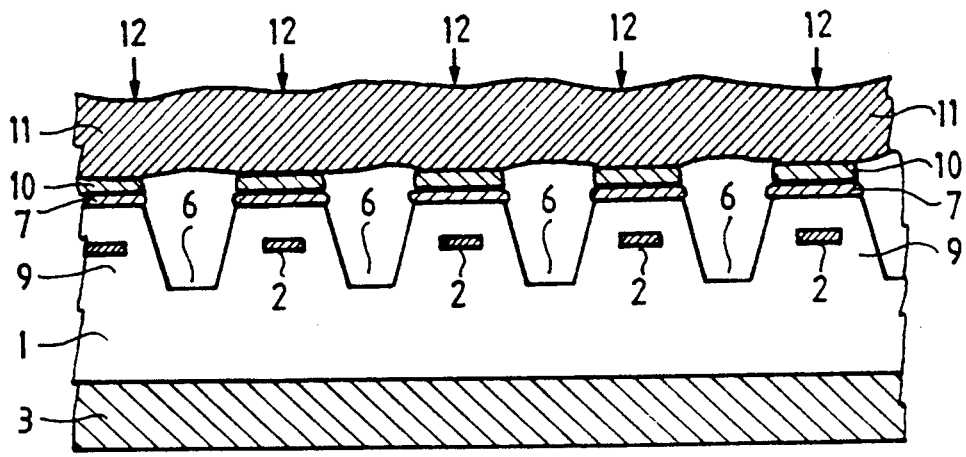
FIG. 2 is a longitudinal cross-section on a row of lasers with an electrical distribution system according to the invention.

FIG. 2 represents the same part of the semiconductor products as FIG. 1. It shows a row of lasers comprising a substrate and semiconductor layers 1, which are not detailed here since they are not fundamental to the invention. One of the layers is the active layer in which the Fabry-Perot cavities, more currently referred to as laser emitters 2, are formed, the current path through these laser emitters 2 being determined by:

metallized electrodes 7 above the laser and metallized electrodes 3 beneath it, grooves 6 which separate the laser emitters in a given row and form a number of mesas 9 surrounding the laser emitter zones 2, possibly, a structure or isolating walls placed on either side of laser emitters 2.

Electrode 3 beneath the row of lasers is a metal plate used as a support: it is capable of carrying a heavy electric current. The same is not true of electrode 7, deposited on mesas 9, which is only approximately 0.3 microns thick.

The first step in the method is, therefore, to electrolytically deposit metal plating, preferably gold, over metallization 7 at position 10. This metal plating 10 will withstand brazing by thermocompression.

The second step in the method is to install the laser polarization rod or thick metal tape 11. Tape 11 is in gold and approximately 40 microns wide (i.e. along the axis of laser emitters 2) by 20 microns thick. Its length depends on the length of the row of lasers itself and is, typically, approximately a centimeter for a row of 30 individual lasers. Tape 11 is brazed to metal films 7 and plating 10 by at least one thermocompression spot 12; to improve both thermal and electrical contact, it is preferable to produce several thermocompression spots 12 on each laser.

Figure 3:
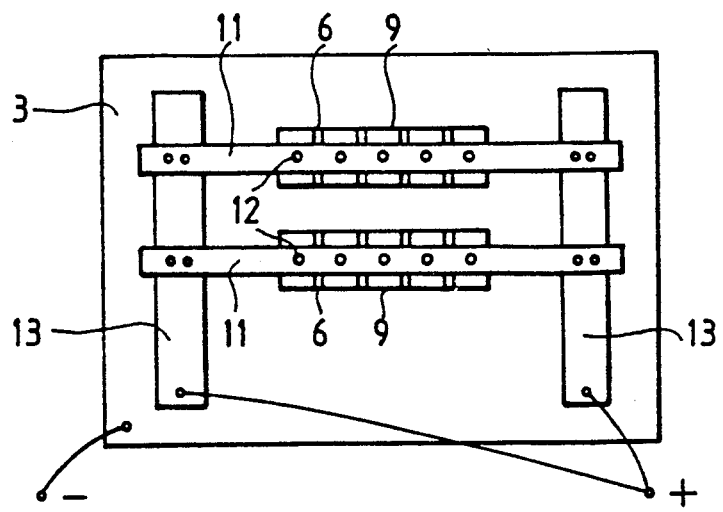
FIG. 3 is a plan view on a device with two rows of lasers and an electrical distribution system according to the invention.

FIG. 3 represents a device with two rows of lasers and a current distribution system according to the invention; the figure is a plan view which corresponds to the cross-section in FIG. 2. On both rows of lasers, mesas 9, which surround lasers 2, are separated by grooves 6. The metal tapes 11 are placed on the rows of layers, in a longitudinal direction, and then brazed by thermocompression at points 12.

To ensure greater uniformity of the voltage applied to all the individual lasers, the metal tape(s) 11 are preferable connected to two metal rails 13 placed one at each end of the tapes 11. Obviously, rails 13 are insulated from metal support 3 which can be used to mount and align the rows of lasers. The two polarities applied to the lasers are connected, for example, negative to support plate 3 and positive to rails 13.

The method can also be applied to a laser integrated circuit: all that is required is to repeat the above operation described for at least one row.

An important feature of the invention, in addition to the uniformity of the voltages applied to the lasers, is that metal tape 11 acts as a heat sink for the individual lasers since it is much larger than gold wires.

What is claimed is:

1. A method of wiring a row of semiconductor lasers comprising a substrate supporting a plurality of mesa structures, each mesa structure surrounding a laser cavity, comprising the steps of:
    electrolytic plating of the metallized areas which cover the mesas,
    thermocompression brazing of a thick metal tape, running the length of the row of lasers, onto the above electrolytic plating.

2. A row of semiconductor lasers comprising a doped substrate and a plurality of mesa structures, each mesa structure surrounding a laser cavity, and a plurality of fine metal films deposited on the mesas, wherein the row of lasers also includes a plurality of thick metal plates deposited over the fine metal films, and a thick metal tape brazed to the thick metal plates by thermocompression, this thick metal tape being placed along the row of lasers.

3. A row of semiconductor lasers as claimed in claim 2, wherein the thick metal tape is longer than the row of lasers and in which a source of electrical current is applied to its two ends.

4. A row of semiconductor lasers as claimed in claim 2, wherein a second source of electric current is applied to the conductive substrate by a metal support on which the aforementioned row of lasers is attached.

5. A method of wiring a row of semiconductor lasers that are on a single substrate, each of the semiconductor lasers having an active region, the active regions of the semiconductor lasers being parallel to one another, the semiconductor laser active regions each being beneath the surface of a different one of a plurality of parallel mesas structures, the mesa structures also being parallel to the semiconductor laser cavities, comprising the steps of:
    forming a plurality of parallel semiconductor laser active regions on a substrate;
    forming a series of parallel mesa structures that are parallel with the semiconductor laser active regions such that each mesa structure is formed around only a single one of the semiconductor active regions, each mesa structure having a top surface and opposing side walls, the active regions being between the opposing side walls and below the top surface so that the single active region is inside the mesa;
    placing a metal tape over the mesas structures so that the metal tape is above the top of each one of the mesa structures;
    electrically connecting the metal tape to the top surface of each one of the mesa structures.

6. A method according to claim 5, further comprising the step of depositing a sub-micron thickness metal a layer on the top surface of each one of the mesas.

7. A method according to claim 6, further comprising the step of electrolytically depositing a metal plating on the top surface of each one of the mesas, above the sub-micron thickness metal layer, the electrolytically deposited layer being thick enough to withstand brazing to the metal tape by thermocompression.

8. A method according to claim 5, wherein the metal tape comprises gold.

9. A method according to claim 5, wherein the metal tape comprises gold and is approximately 20 microns thick.

10. A method according to claim 5, wherein the thickness of the metal tape is approximately 40 microns and the width of the metal tape is approximately 40 microns.

11. The method according to claim 5, wherein the step of electrically connecting the metal tape to the tops of each of the mesas comprises the steps of thermocompressively brazing the metal tape to the metal films on the tops of each one of the mesas.

12. A method according to claim 11, wherein the steps of thermocompressively brazing comprises forming several thermocompressive brazing spots between the metal tape and the top of one of the mesas.

13. A semiconductor laser array device, comprising:
    a substrate;
    a plurality of parallel semiconductor laser active regions disposed on the substrate;
    a plurality of mesa structures formed around the semiconductor laser active regions so that each mesa structure has a top surface that is above a single one of the semiconductor laser active regions and each mesa structure has opposing side surfaces, the semiconductor laser active region of each mesa structure being between the opposing side surfaces and below the top surface so that the semiconductor laser active region is inside the mesa;
    a metal film plated upon the top surface of each one of the mesas;
    a metal tape of approximately 20 microns thickness positioned above the tops of all of the mesas; and
    for each mesa, a thermocompression brazing spot connecting the metal tape to the top surface of that mesa.

14. A device according to claim 13, wherein the metal tape is approximately 40 microns wide and has a length which is at least as long as the length between the mesas which are furthest apart from one another.

15. A method according to claim 1, wherein the thick metal tape is physically and electrically in contact with each of the mesas.

16. A structure according to claim 2, wherein the metal tape is physically and electrically in contact with each one of the mesas.

17. A method according to claim 5, wherein the metal tape is physically and electrically in contact with each of one of the mesas.

18. A device according to claim 13, wherein the metal tape is physically and electrically in contact with each one of the mesas.

* * * * *